US012800613B2

(12) United States Patent
Chang et al.

(10) Patent No.: US 12,800,613 B2
(45) Date of Patent: Nov. 17, 2026

(54) WAFER TESTING APPARATUS

(71) Applicant: CHROMA ATE INC., Taoyuan City (TW)

(72) Inventors: Po-Hsiang Chang, Taoyuan City (TW); Yuan-Heng Huang, Taoyuan City (TW); Shen-Hao Tsai, Taoyuan City (TW)

(73) Assignee: CHROMA ATE INC., Taoyuan City (TW)

( * ) Notice: Subject to any disclaimer, the term of this patent is extended or adjusted under 35 U.S.C. 154(b) by 164 days.

(21) Appl. No.: 18/908,303

(22) Filed: Oct. 7, 2024

(65) Prior Publication Data

US 2025/0251424 A1 Aug. 7, 2025

(30) Foreign Application Priority Data

Feb. 5, 2024 (TW) ................................ 113104472

(51) Int. Cl.
*G01R 31/28* (2006.01)
*G01R 1/073* (2006.01)

(52) U.S. Cl.
CPC ..... *G01R 1/07342* (2013.01); *G01R 31/2893* (2013.01)

(58) Field of Classification Search
CPC ............ G01R 1/07342; G01R 31/2887; G01R 31/2893
See application file for complete search history.

(56) References Cited

U.S. PATENT DOCUMENTS

| | | | | |
|---|---|---|---|---|
| 7,492,175 B2 * | 2/2009 | Smith | .................. | G01R 1/0735 324/755.09 |
| 7,688,062 B2 * | 3/2010 | Nordgren | ........... | G01R 31/2886 324/762.05 |
| 2011/0227602 A1 * | 9/2011 | Schmidt | ............ | G01R 31/2886 324/762.05 |

* cited by examiner

*Primary Examiner* — Tung X Nguyen
(74) *Attorney, Agent, or Firm* — WPAT, PC

(57) ABSTRACT

A wafer testing apparatus includes a base, a chuck, a first lift device and a bridge assembly. The base is movable in a first axis direction. The chuck carries a component under test. The first lift device lifts or lowers the chuck relative to the base in the first axis direction, so as to correspondingly come into contact with or move away from the component under test. The bridge assembly includes an electrical connection device and a second lift device. The electrical connection device includes first and second connection modules electrically connected to each other. The second lift device lifts or lowers the electrical connection device relative to the base in the first axis direction, such that the first connection module correspondingly comes into contact with or moves away from a probe card, and the second connection module correspondingly comes into contact with or moves away from the chuck. Thus, integrity and continuity of test signals are ensured, and compatibility of existing apparatuses is also enhanced.

10 Claims, 5 Drawing Sheets

WAFER TESTING APPARATUS

BACKGROUND OF THE INVENTION

Field of the Invention

The present disclosure relates to a testing apparatus, and more particularly to a wafer testing apparatus for providing a wafer under test with a shorter signal transmission path.

Description of the Prior Art

A manufacturing process of semiconductor elements includes wafer probe, which tests electrical functions of each die of a wafer to identify electrically malfunctioning dies before integrated circuit (IC) packaging, further preventing such malfunctioning dies from entering backend processes.

In the step of wafer probe, a probe of a probe card comes into contact with a test point (for example, a solder pad on a die) serving as an input terminal on the wafer to input a test signal to the corresponding die via the probe, so as to inspect electrical conditions of circuitry and to determine the quality of the die.

A wafer testing apparatus includes an extremely large number of components or operating members. However, after a test signal output from a probe card enters a die under test, in order to shorten a path for returning a signal to the probe card, a new component needs to be additionally installed. The requirement above frequently causes difficulties for the arrangement within a narrow space inside the wafer testing apparatus. As a result, it is imperative to redesign and rearrange the components or operating members within the wafer testing apparatus, hence significantly increasing configuration costs.

SUMMARY OF THE INVENTION

An arrangement is provided in some embodiments disclosed by the present disclosure. By means of modification and/or addition, a device capable of shortening a signal transmission path can be easily arranged within an apparatus of existing designs.

A wafer testing apparatus is provided according to some embodiments. The wafer testing apparatus includes a base, a chuck, a first lift device and at least one bridge assembly. The base is movable in a first axis direction, and is configured to lift or lower a component under test such that the component under test correspondingly comes into contact with or moves away from a probe card. The chuck is made of a conductive material and is configured to selectively carry the component under test. The first lift device is arranged on the base and bears the chuck. The first lift device is configured to lift or lower the chuck relative to the base in the first axis direction, so as to correspondingly come into contact with or move away from the component under test. The bridge assembly includes an electrical connection device and a second lift device. The electrical connection device includes a first connection module and a second connection module electrically connected to each other. The second lift device is arranged on the base and bears the electrical connection device. The second lift device is configured to lift or lower the electrical connection device relative to the base in the first axis direction, such that the first connection module correspondingly comes into contact with or moves away from the probe card, and the second connection module correspondingly comes into contact with or moves away from the chuck.

According to some embodiments, when the first connection module comes into contact with the probe card and the second connection module comes into contact with the chuck, a bridge path between the component under test and the probe card can be established. The bridge path provides a shorter signal transmission path between a wafer under test and the probe card.

According to some embodiments, the component under test can include a wafer under test and a carrier carrying the wafer under test.

According to some embodiments, the electrical connection device can have a step portion on a top thereof. The step portion can have a high part and a low part relative to the high part. The first connection module is arranged on the high part, and the second connection module is arranged on the low part. When the second lift device lifts the electrical connection device such that the second connection module comes into contact with a lower surface of the chuck, the first connection module protrudes from an upper surface of the chuck at the periphery of the chuck.

According to some embodiments, the chuck can have at least one protruding lug portion arranged at the periphery thereof, and a lower surface of the lug portion is configured to come into contact with the second connection module.

According to some embodiments, the chuck can have a plurality of lug portions arranged at intervals. The number of the bridge assembly corresponds to the number of the lug portions. Each of the bridge assemblies corresponds to one of the lug portions, for the second connection module of each of the bridge assemblies to come into contact with the corresponding lug portion after the electrical connection device is lifted by the second lift device.

According to some embodiments, each of the first connection modules can be electrically connected to a conductive sheet at a bottom of the probe card via a plurality of upwardly extending first terminals, and each of the second connection modules can be electrically connected to a bottom surface of the corresponding lug portion via a plurality of upwardly extending second terminals.

According to some embodiments, the chuck can have a plurality of recesses on the periphery thereof, and each of the recesses is for a tooth fork portion of a corresponding support device to extend therein. The support device is fixed on the base, and the component under test is borne by the tooth fork portions of two of the support devices when the chuck is not in contact with the component under test.

Accordingly, with the coordination of the chuck, the first lift device and the bridge assembly, in addition to being configurable on an existing base and movable along with the base, the bridge assembly and the chuck can form an arrangement relationship of being operable separately without interfering with each other, hence ensuring integrity and continuity of test signals as well as significantly enhancing compatibility of existing apparatuses.

DETAILED DESCRIPTION OF THE EMBODIMENTS

The objectives, features, and advantages of the present disclosure are hereunder illustrated with specific embodiments, depicted with drawings, and described below.

In the disclosure, descriptive terms such as "a" or "one" are used to describe the unit, component, structure, device, module, portion, section or region, and are for illustration purposes and providing generic meaning to the scope of the present invention. Therefore, unless otherwise explicitly specified, such description should be understood as including one or at least one, and a singular number also includes a plural number.

In the disclosure, descriptive terms such as "include, comprise, have" or other similar terms are not for merely limiting the essential elements listed in the disclosure, but can include other elements that are not explicitly listed and are however usually inherent in the units, components, structures, devices, modules, portions, sections or regions.

In the disclosure, the terms similar to ordinals such as "first" or "second" described are for distinguishing or referring to associated identical or similar components, structures, portions, or regions, and do not necessarily imply the orders of these components, structures, portions, sections or regions in a spatial aspect. It should be understood that, in some situations or configurations, the ordinal terms could be interchangeably used without affecting the implementation of the present invention.

Figure 1:
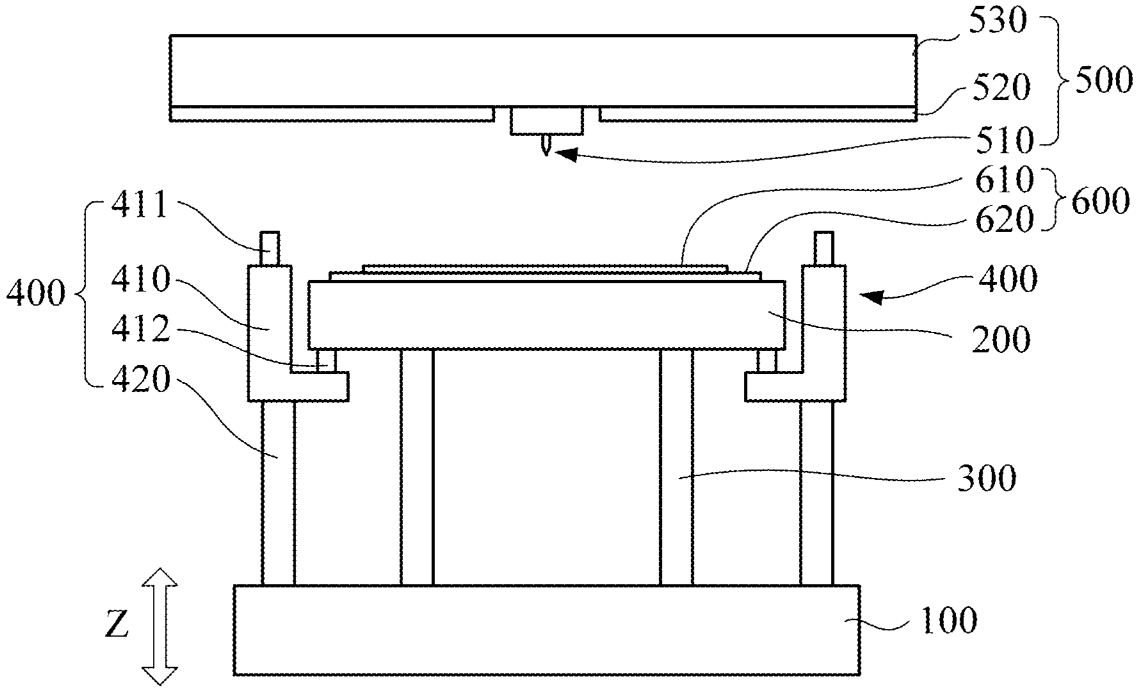
FIG. 1 is a side sectional diagram of a wafer testing apparatus according to some embodiments.
Figure 2:
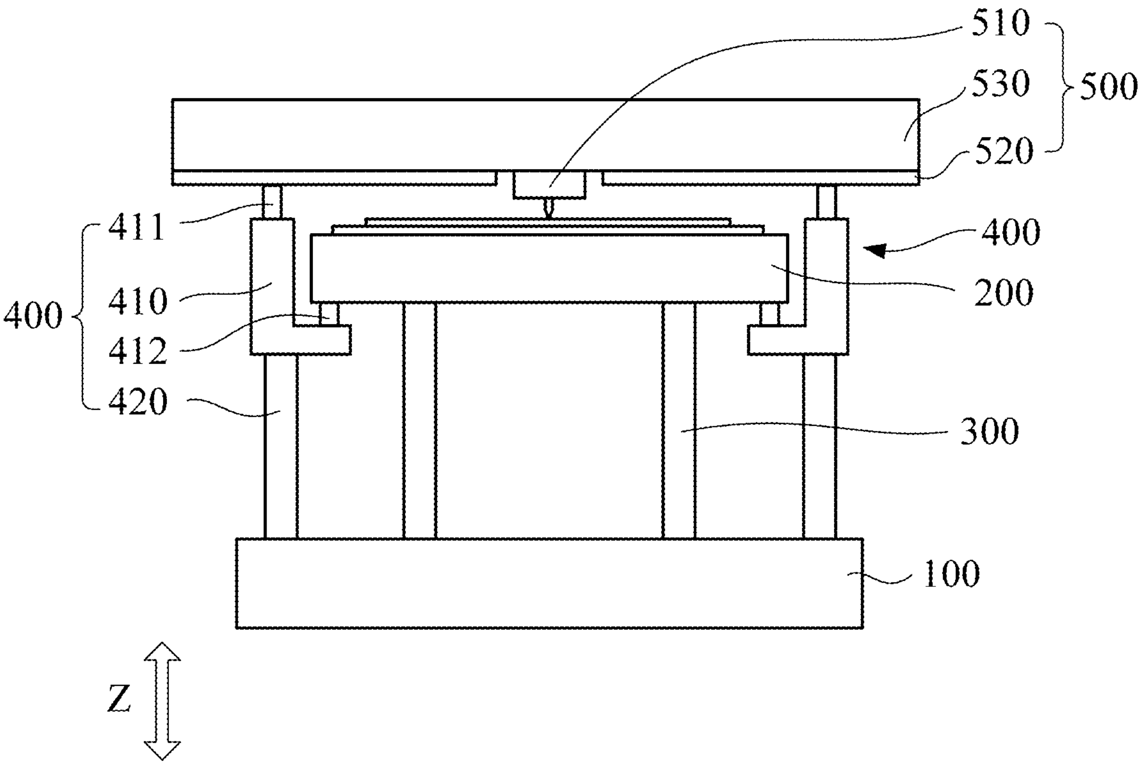
FIG. 2 is a schematic diagram after the base of the embodiment in FIG. 1 moves up.

Refer to FIG. 1 and FIG. 2. FIG. 1 shows a side sectional diagram of a wafer testing apparatus according to some embodiments, and FIG. 2 shows a schematic diagram after the base of the embodiment in FIG. 1 moves up. The wafer testing apparatus includes a base 100, a chuck 200, a first lift device 300 and at least one bridge assembly 400.

In the wafer testing apparatus, the base 100 is usually configured to have a movement ability in multiple axis directions, and such is configured according to a method for testing a wafer to be provided by the wafer testing apparatus. For example, the base 100 may have a movement ability in a first axis direction (the Z axis), a second axis direction (the X axis, not shown in the drawings above and can refer to FIG. 4), and a third axis direction (the Y axis, not shown in the drawings above and can refer to FIG. 4), and have a rotation ability in at least one axis direction.

Taking this embodiment for example, the base 100 provides a movement ability in the first axis direction (the Z axis), for the chuck 200 and a probe card 500 to have a movement relationship to a certain extent. Usually, the chuck 200 carrying a component under test 600 is moved close by driving the base 100, such that a test point of a wafer under test 610 of the component under test 600 can be close to the probe card 500 so as to perform a probe step. For example, the base 100 lifts or lowers the component under test 600, such that the component under test 600 comes into contact with a bottom of the probe card 500 or moves away from the probe card 500. However, whether the component under test 600 is placed close by moving the probe card 500 or by moving both of the chuck 200 and the probe card 500 is suitable for the embodiments disclosed by the present disclosure.

The chuck 200 is configured to carry the component under test 600, and is made of a conductive material with electrically conductive properties, including a metal material or a non-metal material but with electrically conductive properties. The chuck 200 enables the bridge assembly 400 to establish an electrical connection relationship with the component under test 600 on the chuck 200 by coming into contact with the chuck 200. The bridge assembly 400 includes an electrical connection device 410 and a second lift device 420. The electrical connection device 410 has a first connection module 411 configured to come into contact with the bottom of the probe card 500 and a second connection module 412 configured to come into contact with the chuck 200.

For example, during an operation of the second lift device 420 arranged on the base 100, the electrical connection device 410 can be lifted or lowered relative to the base 100 in the first axis direction Z, such that the first connection module 411 correspondingly gets close to or moves away from the bottom of the probe card 500, and the second connection module 412 correspondingly gets close to or moves away from a bottom of the chuck 200.

As shown in FIG. 1 and FIG. 2, the electrical connection device 410 has a step portion on a top thereof. The step portion has a high part and a low part relative to the high part. The first connection module 411 is arranged on the high part, and the second connection module 412 is arranged on the low part. When the second lift device 420 lifts the electrical connection device 410 such that the second connection module 412 comes into contact with a lower surface of the chuck 200, the first connection module 411 is located at the periphery of the chuck 200 and exhibits a state of protruding from an upper surface of the chuck 200.

As shown in FIG. 2, after the base 100 moves up, the first connection module 411 is allowed to establish an electrical connection with the probe card 500, and the second connection module 412 is allowed to establish an electrical connection with the bottom of the chuck 200. In the electrical connection device 410, for example, the first connection module 411 is electrically connected to the second connection module 412 by a conductive line or other means. Accordingly, a short path between the chuck 200 and the probe card 500 is established, forming a bridge path between the component under test 600 and the probe card 500. This bridge path provides a shorter signal transmission path between the wafer under test 610 and the probe card 500.

The first lift device 300 is arranged on the base 100, and is configured to bear the chuck 200. The first lift device 300 is configured to lift or lower the chuck 200 relative to the base 100 in the first axis direction Z, such that the chuck 200 correspondingly gets close to or moves away from the component under test 600. When the first lift device 300 extends on the base 100 to further lift the chuck 200 such that the chuck 200 comes into contact with a bottom surface of the component under test 600, first-stage positioning is completed. The second lift device 420 then extends on the base 100 to lift the electrical connection device 410 such that the second connection module 412 comes into contact with the bottom surface of the chuck 200, and second-stage positioning is completed, hence completing pre-steps of a testing process up to this point. Next, the base 100 performs an operation in the first axis direction Z. The first lift device 300 and the second lift device 420 fixed on the base 100 are together lifted, such that the component under test 600 is lifted and comes into contact with a probe portion 510 of the probe card 500 (as shown in FIG. 2). At this point in time, the first connection module 411 simultaneously comes into contact with a conductive sheet 520 on a bottom surface of the probe card 500, hence completing a shorter signal transmission path between the component under test 600 and the probe card 500. With subsequent control of the base 100, each die of the wafer under test 610 on the component under test 600 sequentially comes into contact with the probe portion 510 at the bottom of the probe card 500 so as to perform the probe step.

The first lift device 300 and the second lift device 420 can be, for example, pneumatic moving mechanisms capable of forming extended or compressed implementation forms; other devices capable of achieving moving effects in axis directions are also suitable.

Figure 3:
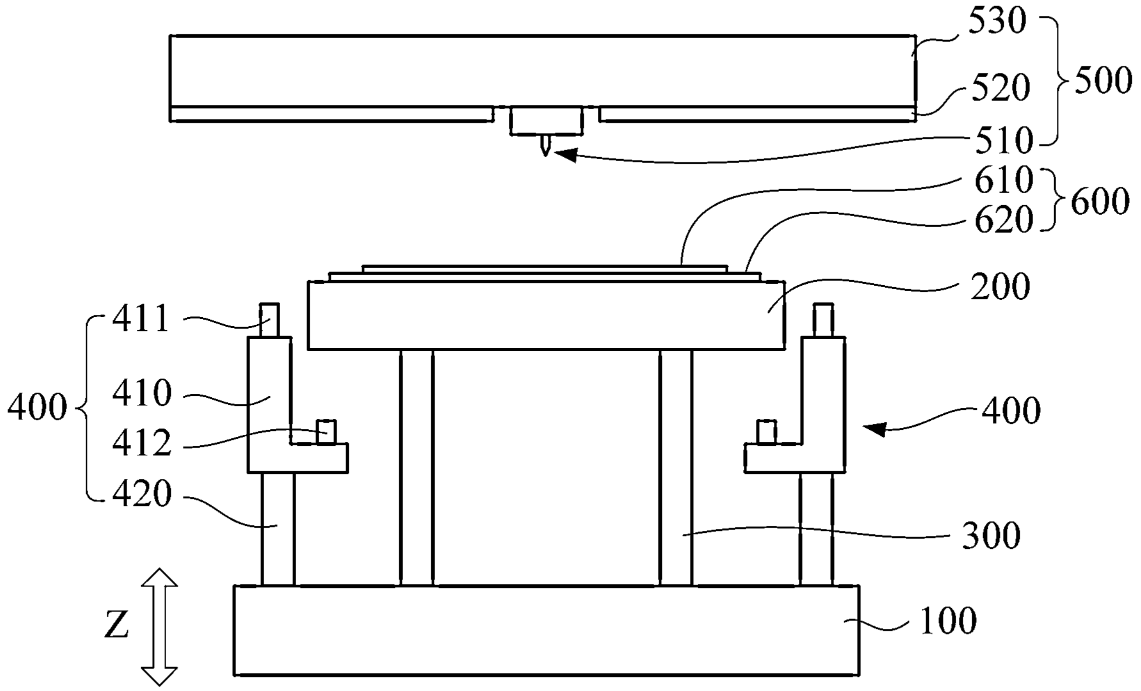
FIG. 3 is a schematic diagram after the base of the embodiment in FIG. 1 moves down and the bridge assembly also moves down.

Refer to FIG. 3 showing a schematic diagram after the base of the embodiment in FIG. 1 moves down and the bridge assembly also moves down. From another aspect, when the probe step of the wafer under test 610 of the component under test 600 is completed, the base 100 first moves down such that the component under test 600 moves away from the probe card 500. Then, the second lift device 420 performs compression such that the first connection module 411 moves away from the probe card 500 and the chuck 200 and a top surface of the first connection module 411 is lower than the bottom surface of the chuck 200, and meanwhile the second connection module 412 is also away from the chuck 200, as the state shown in FIG. 3. Thus, the bridge assembly 400 does not interfere with fetching or placing of the component under test 600 by other mechanical parts. In some embodiments, in the subsequent operation control, the first lift device 300 can perform compression such that the chuck 200 descends in the first axis direction Z, so as to spare space required for other mechanical parts to fetch or place the component under test 600.

Referring to FIG. 1 to FIG. 3, as described above, the probe card 500 includes the probe portion 510, the conductive sheet 520 and a base plate 530. Once aligning and moving steps in the testing process are completed, the probe portion 510 can come into contact with a selected die under test on the wafer under test 610 (for example, the probe portion 510 is a probe), so as to transmit a test signal into the die under test. The probe portion 510 is shown as one single probe in FIG. 1 and FIG. 2 as an example, and is not limited to such example. The probe portion 510 can be fixed on the base plate 530.

The base plate 530 is usually configured with various electronic components on its top surface, and relevant circuits are arranged both on the top surface and inside the base plate 530. An insulating layer is provided on a bottom surface of the base plate 530, and the conductive sheet 520 is usually attached to below the insulating layer, further forming a contact surface by which the bottom of the probe card 500 is electrically connected to the bridge assembly 400. The conductive sheet 520 can be arranged around the probe portion 510. The conductive sheet 520 arranged on the bottom surface of the base plate 530 can be electrically connected to an electronic element on the probe card 500 via lines disposed on the base plate 530 and/or disposed in the interior of the base plate 530, so as to transmit the received test signal to a corresponding functional module for proceeding of certain electrical analysis steps.

Figure 4:
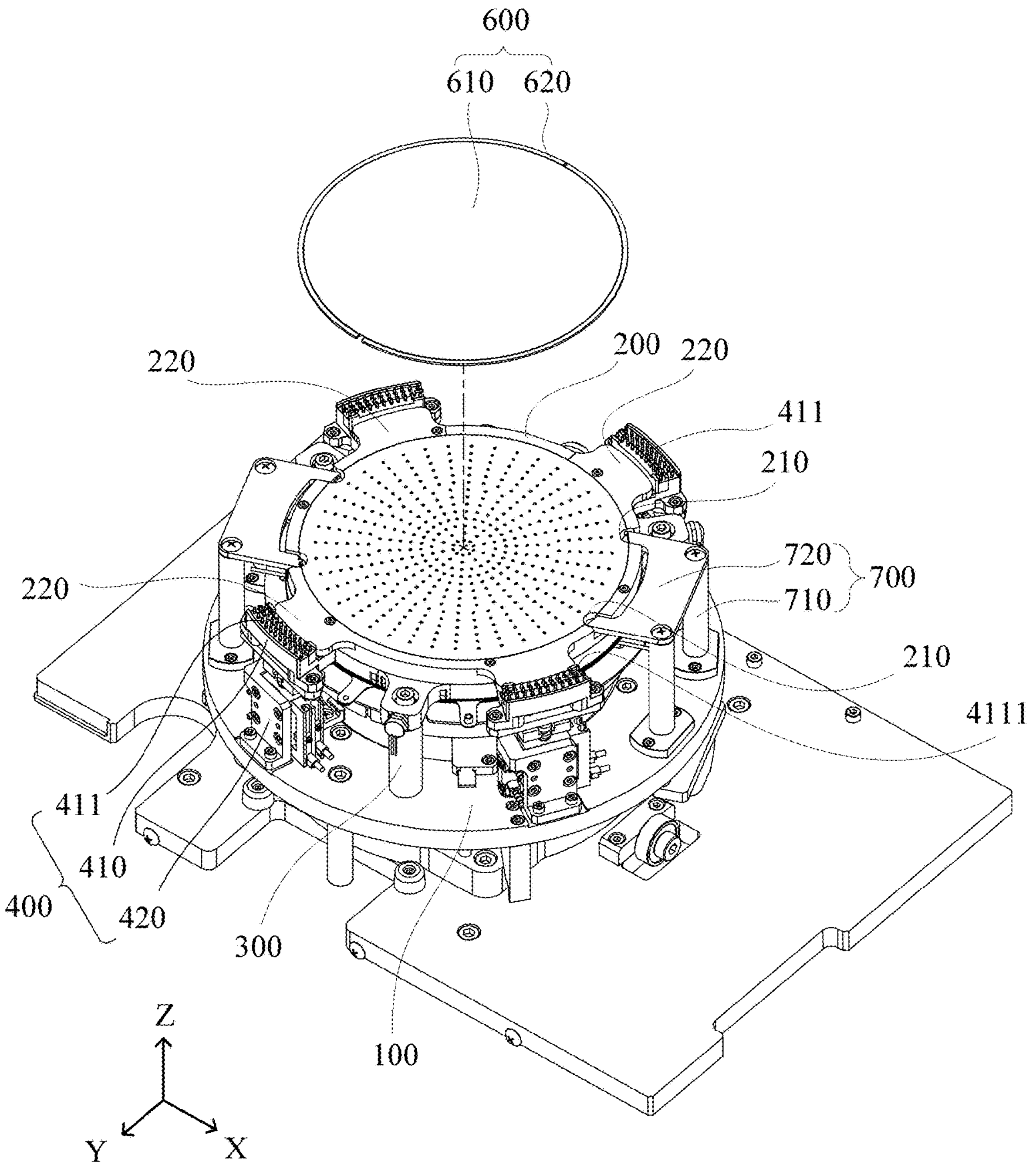
FIG. 4 is a perspective schematic diagram of part of devices of a wafer testing apparatus according to some embodiments.
Figure 5:
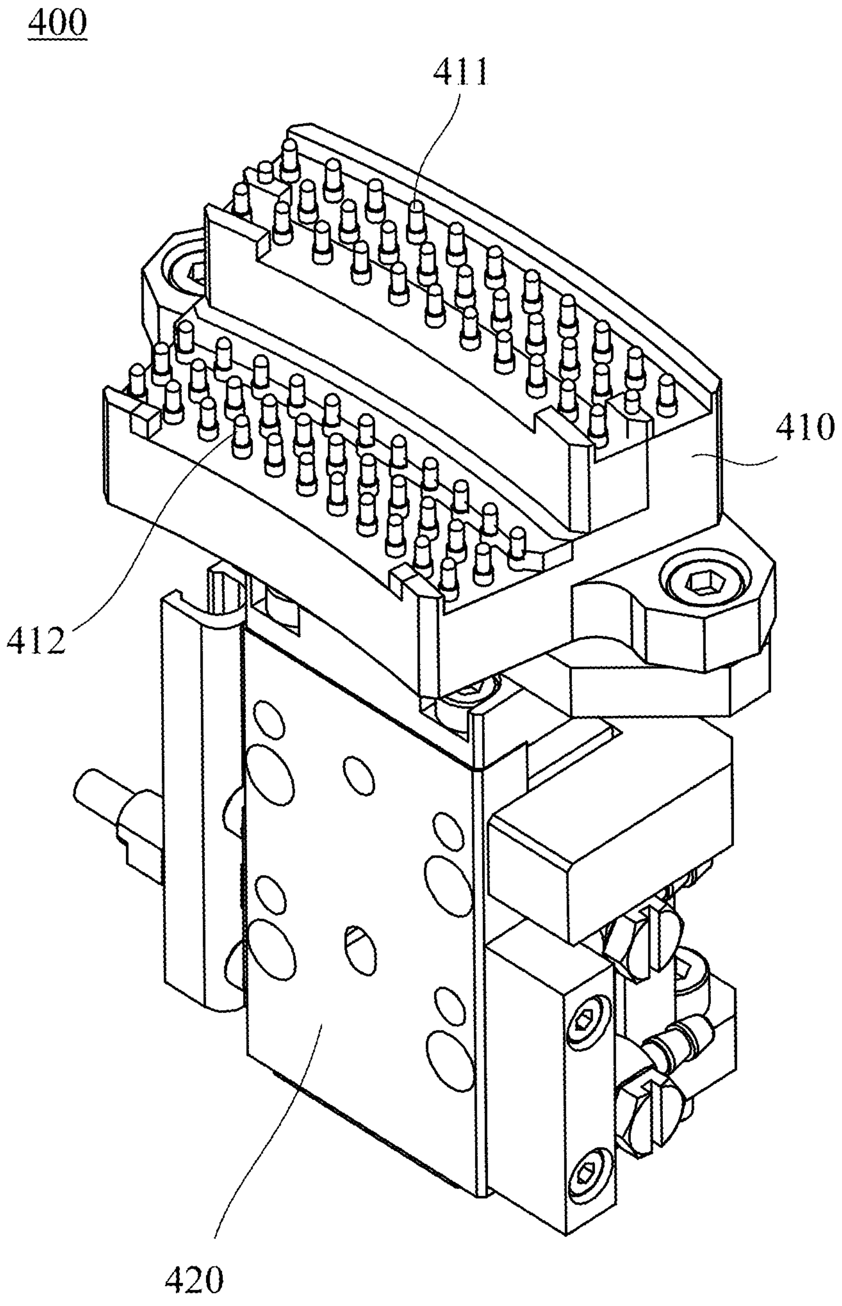
FIG. 5 is a perspective schematic diagram of the bridge assembly of the embodiment in FIG. 4.

Referring to FIG. 4 and FIG. 5, FIG. 4 shows a perspective schematic diagram of part of devices of a wafer testing apparatus according to some embodiments, and FIG. 5 shows a perspective schematic diagram of the bridge assembly of the embodiment in FIG. 4. FIG. 4 depicts a drawing in which the component under test 600 is not yet placed on a support device 700 or on the chuck 200 so as to better observe a spatial configuration relationship of the structures.

Two support devices 700 are fixed on the base 100, and each of the support devices 700 has a pair of upright columns 710 and a tooth fork portion 720 supported by the upright columns 710. A front end of the tooth fork portion 720 is configured to bear the component under test 600 for other mechanical parts to fetch or place the component under test 600. The component under test 600 includes the wafer under test 610 and a carrier 620 for carrying the wafer under test 610. The carrier 620 is, for example, made of a conductive material having electrically conductive properties (including a metal material or a non-metal material with electrically conductive properties), and can appear as a sheet.

The chuck 200 has a plurality of recesses 210 on the periphery thereof. Each of the recesses 210 is for the front end of the tooth fork portion 720 of the corresponding support device 700 to extend therein. More specifically, when the chuck 200 is lifted such that the upper surface of the chuck 200 comes into contact with a lower surface of the carrier 620 of the component under test 600 for forming an electrical connection, each of the recesses 210 of the chuck 200 exactly receives the front end of the corresponding tooth fork portion 720. Accordingly, when the chuck 200 is lowered, the component under test 600 can still be borne by the support device 700.

In some embodiments, the chuck 200 has at least one protruding lug portion 220 arranged on the periphery. A lower surface of the lug portion 220 is for coming into contact with the second connection module 412 to form an electrical connection.

In the embodiments in FIG. 4 and FIG. 5, the chuck 200 has four lug portions 220 arranged at intervals. The number of the bridge assembly 400 corresponds to the number of the lug portions 220, and is also four. Each of the bridge assemblies 400 corresponds to one lug portion 220. Once the electrical connection device 410 is lifted by the second lift device 420, the second connection module 412 of each of the bridge assemblies 410 can come into contact with a bottom surface of the corresponding lug portion 220.

In some embodiments, each of the first connection modules 411 can be electrically connected to the conductive sheet 520 (not shown in FIG. 4) at the bottom of the probe card 500 (not shown in FIG. 4) via a plurality of upwardly extending first terminals. Each of the second connection modules 412 can be electrically connected to the bottom surface of the corresponding lug portion 220 via a plurality of upwardly extending second terminals. In the embodiment shown in FIG. 4, the first connection modules 411 and the second connection modules 412 are exemplified by pogo pins.

In conclusion, with the configuration and arrangement of the first lift device and the bridge assembly, a short path between the chuck and the probe card is established by the bridge assembly, forming a bridge path between the component under test and the probe card, thereby providing a shorter signal transmission path. Furthermore, with the configuration of the first lift device and the second lift device, the chuck and the electrical connection devices can be properly arranged within the wafer testing apparatus, forming an arrangement where they can operate independently without interfering with each other. This ensures the integrity and continuity of test signals and significantly enhances compatibility with existing apparatuses.

The present invention has been disclosed through various embodiments. However, it should be understood by those skilled in the art that the embodiments are merely illustrative and not restrictive of the scope of the present invention. After perusing this specification, persons skilled in the art may come up with other aspects and embodiments without departing from the scope of the present disclosure. All equivalent variations and replacements of the aspects and the embodiments must fall within the scope of the present disclosure. Therefore, the scope of the protection of rights of the present invention shall be defined by the appended claims.

What is claimed is:

1. A wafer testing apparatus, comprising:
- a base, movable in a first axis direction, configured to lift or lower a component under test so as to correspondingly come into contact with or move away from a probe card;
- a chuck, made of a conductive material, configured to selectively carry the component under test;
- a first lift device, arranged on the base and bearing the chuck, the first lift device configured to lift or lower the chuck relative to the base in the first axis direction so as to correspondingly come into contact with or move away from the component under test; and
- at least one bridge assembly, comprising:
  - an electrical connection device, having a first connection module and a second connection module electrically connected to each other; and
  - a second lift device, arranged on the base and bearing the electrical connection device, the second lift device configured to lift or lower the electrical connection device relative to the base in the first axis direction, such that the first connection module correspondingly comes into contact with or moves away from the probe card, and the second connection module correspondingly comes into contact with or moves away from the chuck.

2. The wafer testing apparatus according to claim 1, wherein when the first connection module comes into contact with the probe card and the second connection module comes into contact with the chuck, a bridge path between the component under test and the probe card is established.

3. The wafer testing apparatus according to claim 1, wherein the component under test comprises a wafer under test and a carrier carrying the wafer under test.

4. The wafer testing apparatus according to claim 3, wherein the carrier is a thin sheet made of a conductive material.

5. The wafer testing apparatus according to claim 1, wherein the electrical connection device has a step portion on a top thereof, the step portion has a high part and a low part relative to the high part, the first connection module is arranged on the high part, the second connection module is arranged on the low part, and when the second lift device lifts the electrical connection device such that the second connection module comes into contact with a lower surface of the chuck, the first connection module protrudes from an upper surface of the chuck at the periphery of the chuck.

6. The wafer testing apparatus according to claim 1, wherein the chuck has at least one protruding lug portion arranged on the periphery thereof, and a lower surface of the lug portion is configured to come into contact with the second connection module.

7. The wafer testing apparatus according to claim 6, wherein the chuck has a plurality of the lug portions arranged at intervals, a number of the bridge assembly corresponds to a number of the lug portions, and each of the bridge assemblies corresponds to one of the lug portions, such that the second connection module of each of the bridge assemblies comes into contact with the corresponding lug portion after the electrical connection device is lifted by the second lift device.

8. The wafer testing apparatus according to claim 7, wherein each of the first connection modules is electrically connected to a conductive sheet at a bottom of the probe card via a plurality of upwardly extending first terminals, and each of the second connection modules is electrically connected to a bottom surface of the corresponding lug portion via a plurality of upwardly extending second terminals.

9. The wafer testing apparatus according to claim 8, wherein each of the first terminals and second terminals is a pogo pin.

10. The wafer testing apparatus according to claim 6, wherein the chuck has a plurality of recesses on the periphery thereof, each of the recesses is for a tooth fork portion of a corresponding support device to extend therein, the support device is fixed on the base, and the component under test is borne by the tooth fork portions of two of the support devices when the chuck is not in contact with the component under test.

* * * * *